United States Patent
Chen et al.

(10) Patent No.: US 11,380,771 B2
(45) Date of Patent: Jul. 5, 2022

(54) HIGH ELECTRON MOBILITY TRANSISTOR DEVICE AND MANUFACTURING METHOD THEREOF

(71) Applicant: Nuvoton Technology Corporation, Hsinchu (TW)

(72) Inventors: Chih-Wei Chen, Hsinchu (TW); Wen-Ying Wen, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 16/672,495

(22) Filed: Nov. 3, 2019

(65) Prior Publication Data
US 2020/0144382 A1    May 7, 2020

(30) Foreign Application Priority Data
Nov. 5, 2018 (TW) .................. 107139148

(51) Int. Cl.
*H01L 29/423* (2006.01)
*H01L 29/66* (2006.01)
*H01L 29/778* (2006.01)

(52) U.S. Cl.
CPC .... *H01L 29/4236* (2013.01); *H01L 29/66462* (2013.01); *H01L 29/7786* (2013.01)

(58) Field of Classification Search
CPC ........... H01L 29/4236; H01L 29/66462; H01L 29/7786; H01L 21/8252; H01L 27/0883; H01L 27/092; H01L 27/085; H01L 27/0629; H01L 29/872; H01L 29/1029; H01L 29/2003; H01L 27/0605; H01L 29/778; H01L 29/66431
See application file for complete search history.

(56) References Cited

U.S. PATENT DOCUMENTS

| | | | |
|---|---|---|---|
| 2009/0146185 A1 | 6/2009 | Suh et al. | |
| 2013/0237021 A1 | 9/2013 | Derluyn et al. | |
| 2013/0337619 A1* | 12/2013 | Zhu | H02M 3/33507 438/172 |
| 2018/0248027 A1* | 8/2018 | Okita | H01L 29/1029 |

FOREIGN PATENT DOCUMENTS

| | | |
|---|---|---|
| TW | 201314888 | 4/2013 |
| TW | 201735184 | 10/2017 |
| TW | 201810671 | 3/2018 |

* cited by examiner

*Primary Examiner* — Mohammed R Alam
(74) *Attorney, Agent, or Firm* — JCIPRNET

(57) ABSTRACT

A high electron mobility transistor (HEMT) device and a manufacturing method thereof are provided. The HEMT device includes a channel layer, a barrier layer, a first gate electrode, a first drain electrode and a first source electrode. The channel layer is disposed on a substrate. A surface of a portion of the channel layer within a first region of the HEMT device includes a polar plane and a non-polar plane. The barrier layer is conformally disposed on the channel layer. The first gate electrode is disposed on the barrier layer, and located within the first region. The first drain electrode and the first source electrode are disposed within the first region, and located at opposite sides of the first gate electrode.

14 Claims, 12 Drawing Sheets

HIGH ELECTRON MOBILITY TRANSISTOR DEVICE AND MANUFACTURING METHOD THEREOF

CROSS-REFERENCE TO RELATED APPLICATION

This application claims the priority benefit of Taiwan application serial no. 107139148, filed on Nov. 5, 2018. The entirety of the above-mentioned patent application is hereby incorporated by reference herein and made a part of this specification.

BACKGROUND

Technical Field

The present invention is related to a transistor device and manufacturing method thereof, and more particularly, to a high electron mobility transistor (HEMT) device and manufacturing method thereof.

Description of Related Art

High electron mobility transistor (HEMT) is a type of a transistor. HEMT includes a hetero-junction formed by two semiconductor materials with different band gaps. Two dimensional electron gas or two dimensional hole gas can be formed at the hetero-junction, and can be functioned as a conductive channel in HEMT. HEMT is featured in having low resistance, high breakdown voltage and high switching rate etc., thus is comprehensively applied in the field of high power electronic device.

HEMT can be categorized into a depletion mode HEMT having a normally-on channel and an enhancement mode HMET having a normally-off channel. The enhancement mode HEMT is widely studied due to its merits of high safety and being able to be controlled by a driving circuit that is less complicated and less expensive.

SUMMARY

The present invention provides a HEMT device and a manufacturing method thereof. Since the HEMT device has a three dimensional channel structure, the HEMT device can be an enhancement mode HEMT.

A HEMT device according to some embodiments of the present invention includes a channel layer, a barrier layer, a first gate electrode, a first drain electrode and a first source electrode. The channel layer is disposed on a substrate. A surface of a portion of the channel layer located within a first region of the high electron mobility transistor device comprises a polar plane and a non-polar plane. The barrier layer is conformally disposed on the channel layer. The first gate electrode is disposed on the barrier layer, and located within the first region. The first drain electrode and the first source electrode are disposed within the first region, and located at opposite sides of the first gate electrode.

In some embodiments, the polar plane and the non-polar plane is substantially perpendicular with each other.

In some embodiments, the channel layer comprises a body portion and a protruding portion, the protruding portion protrudes from the body portion along a direction substantially normal to a surface of the substrate. A sidewall of the protruding portion is the non-polar plane, and a top surface of the protruding portion is a portion of the polar plane.

In some embodiments, the first gate electrode covers the top surface of the protruding portion.

In some embodiments, the first gate electrode covers the top surface and the sidewall of the protruding portion.

In some embodiments, the channel layer has a recess. A sidewall of the recess is the non-polar plane, and a bottom surface of the recess is a portion of the polar plane. At least a portion of the first gate electrode is located in the recess.

In some embodiments, a top surface of a portion of the channel layer located within a second region of the high electron mobility transistor device comprises a polar plane. The high electron mobility transistor device further comprises a second gate electrode, a second drain electrode and a source electrode. The second gate electrode is disposed on a portion of the barrier layer located within the second region. The second drain electrode and the second source electrode are disposed within the second region, and located at opposite sides of the second gate electrode.

In some embodiments, a top surface of a portion of the channel layer located within a third region of the high electron mobility transistor device comprises a polar plane. The high electron mobility transistor device further comprises a first electrode and a second electrode. The first electrode is disposed in the channel layer and the barrier layer, and located within the third region. The second electrode is disposed on a portion of the barrier layer located within the third region, and located aside the first electrode.

A manufacturing method of a HEMT device according to some embodiments of the present invention comprises: forming a channel material layer on a substrate; patterning a portion of the channel material layer located within a first region of the high electron mobility transistor device, so as to form a channel layer, wherein a surface of a portion of the channel layer within the first region comprises a polar plane and a non-polar plane; conformally forming a barrier layer on the channel layer; forming a first gate electrode on a portion of the barrier layer within the first region; and forming a first drain electrode and a first source electrode within the first region, wherein the first drain electrode and the first source electrode are located at opposite sides of the first gate electrode.

In some embodiments, a method of patterning the portion of the channel material within the first region comprises removing portions of the channel material layer from the surface of the channel material layer, such that a top portion of the channel layer has a first recess and a second recess adjacent with each other. Sidewalls of the first recess and the second recess are portions of the non-polar plane, and bottom surfaces of the first recess and the second recess are portions of the polar plane.

In some embodiments, the first gate electrode is formed on a portion of the channel layer between the first recess and the second recess.

In some embodiments, the first gate electrode further extends into the first recess and the second recess.

In some embodiments, a method of patterning the portion of the channel material within the first region comprises forming a recess at a surface of the channel material layer. A sidewall of the recess is a portion of the non-polar plane, and a bottom surface of the recess is a portion of the polar plane. The first gate electrode is formed in the recess.

In some embodiments, the manufacturing method of the high electron mobility transistor device further comprises: forming a second gate electrode on a portion of the barrier layer within a second region of the high electron mobility transistor device; and forming a second drain electrode and a second source electrode within the second region, wherein the second drain electrode and the second source electrode are located at opposite sides of the second gate electrode.

In some embodiments, the manufacturing method of the high electron mobility transistor device further comprises: forming a first electrode in portions of the channel layer and the barrier layer within a third region of the high electron mobility transistor device; and forming a second electrode on a portion of the barrier layer within the third region, wherein the first electrode is located aside the second electrode.

As above, the HEMT of the embodiments in the present invention has a three dimensional channel structure. This three dimensional channel structure has a polar plane and a non-polar plane. A hetero-junction formed by the barrier layer and portions of the channel layer having polar planes may induce the two dimensional electron gas (or two dimensional hole gas) even if a bias voltage is not applied. On other hand, a hetero-junction formed by the barrier layer and a portion of the channel layer having a non-polar plane does not form any two dimensional electron gas (or two dimensional hole gas). In other words, such discontinuous two dimensional electron gas can be regarded as a discontinuous conductive channel while a proper bias voltage is not applied. A continuous conductive channel can be formed only if a proper bias voltage is applied. Therefore, this HEMT can be an enhancement mode HEMT, which is also referred as a normally-off HEMT. Regarding a threshold voltage of HEMT, the enhancement mode HEMT is beneficial for circuit design. In some embodiments, the enhancement mode HEMT, the depletion mode HEMT and the schottky diode may be integrated into the HEMT device, which forms a basic logic integrated circuit.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
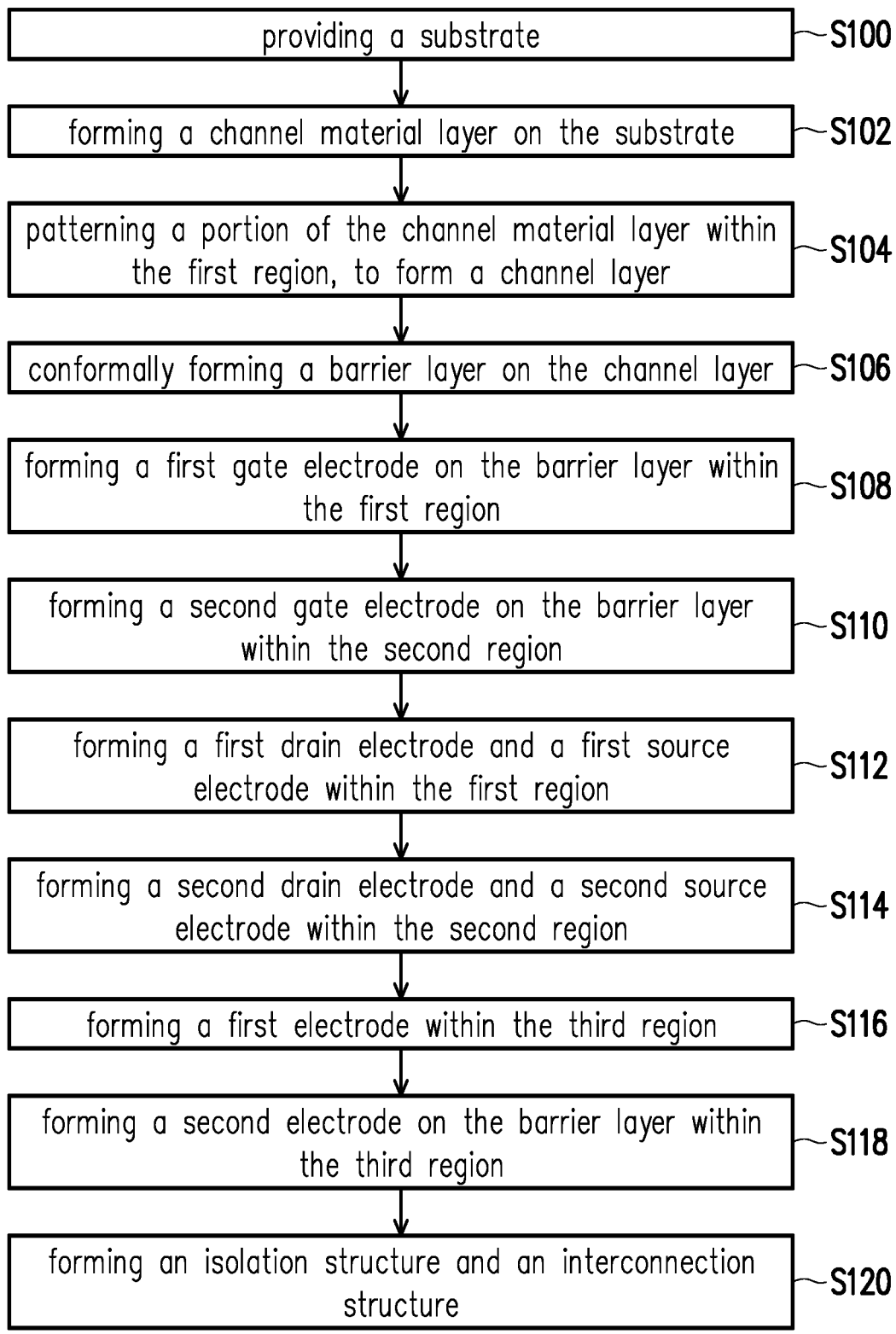
FIG. 1 is a process flow diagram illustrating a manufacturing method of a HEMT device according to some embodiments of the present invention.

FIG. 1 is a process flow diagram illustrating a manufacturing method of a HEMT device 10 according to some embodiments of the present invention. FIG. 2A through FIG. 2H are cross-sectional views illustrating structures at various stages of the manufacturing method of the HEMT device 10 shown in FIG. 1. In some embodiments, the manufacturing method of the HEMT device 10 includes the following steps.

Figure 2A:
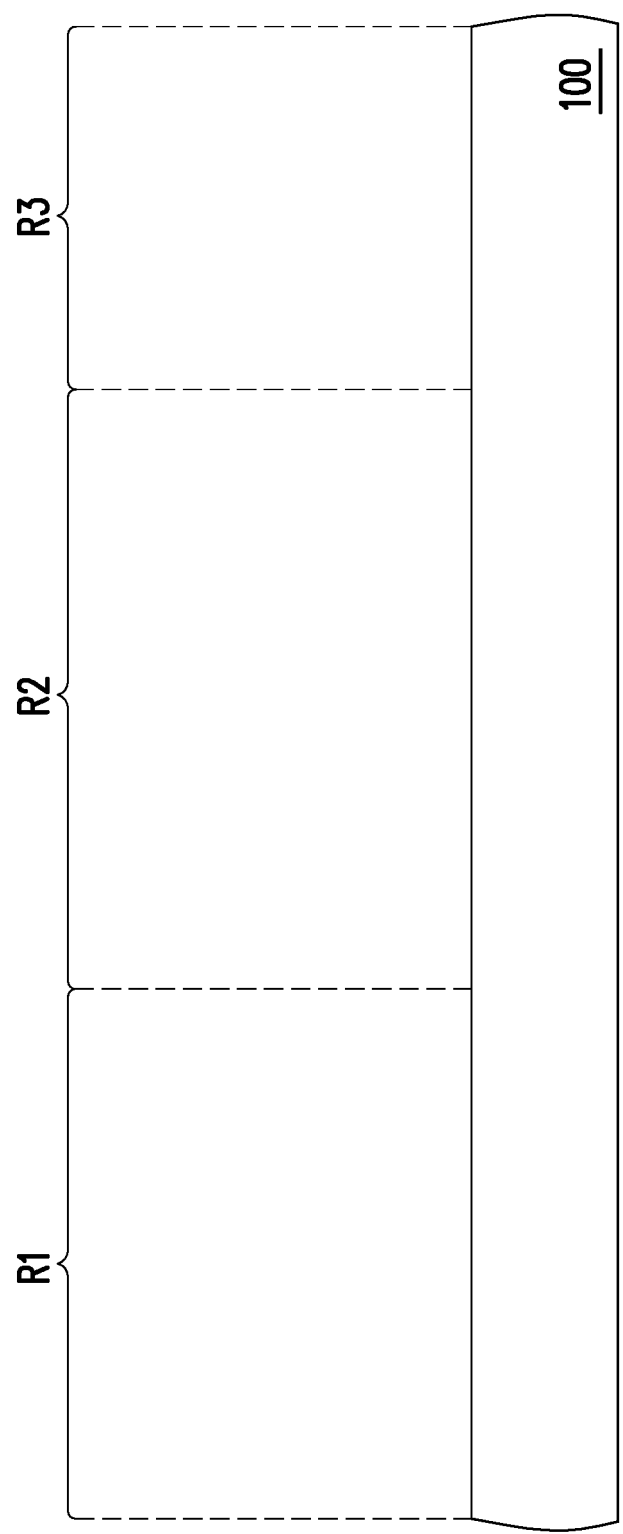
FIG. 2A through FIG. 2H are cross-sectional views illustrating structures at various stages of the manufacturing method of the HEMT device shown in FIG. 1.

Referring to FIG. 1 and FIG. 2A, step S100 is performed, and a substrate 100 is provided. In some embodiments, the substrate 100 includes a semiconductor substrate or a semiconductor on insulator (SOI) substrate. The semiconductor material in the semiconductor substrate or the SOI substrate may include an elemental semiconductor, a semiconductor alloy or a semiconductor compound. For instance, the elemental semiconductor may include Si or Ge. The semiconductor alloy may include SiGe, SiGeC or the like. The semiconductor compound may include SiC, a group III-V semiconductor material or a group II-VI semiconductor material. The group III-V semiconductor material may include GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs or InAlPAs. The group II-VI semiconductor material may include CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe or HgZnSTe. In addition, the semiconductor material may be doped as a first conductive type or a second conductive type complementary to the first conductive type. For instance, the first conductive type is N type, and the second conductive type is P type.

In some embodiments, the substrate 100 may have a first region R1, a second region R2 and a third region R3. The first region R1, the second region R2 and the third region R3 may connected with one another, or may be separated from each other. In some embodiments, the second region R2 is located between the first region R1 and the third region R3, but the present invention is not limited the configuration of these regions. In the following steps, an enhancement mode HEMT (e.g., the transistor T1 shown in FIG. 2H) may be formed within the first region R1. In some embodiments, a depletion mode HEMT (e.g., the transistor T2 shown in FIG. 2H) may be formed within the second region R2. In alternative embodiments, another enhancement mode HEMT (not shown) may be formed within the second region R2, and has a conductive type complementary to a conductive type of the enhancement mode HEMT formed within the first region R1 (e.g., the transistor T1 shown in FIG. 2H). Moreover, a schottky diode (e.g., the diode D shown in FIG. 2H) may be formed within the third region R3. However, those skilled in the art may dispose other semiconductor devices within the second region R2 and the third region R3 according to design requirements, the present invention is not limited thereto.

Figure 2B:
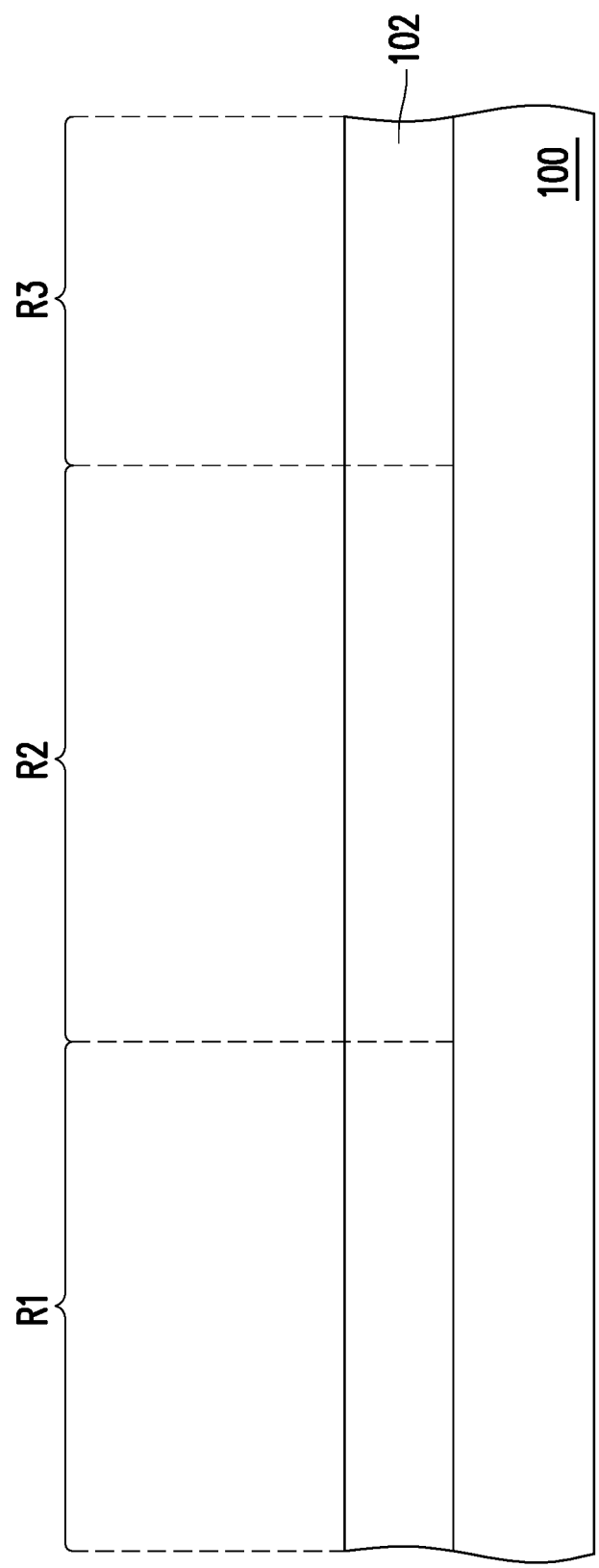

Referring to FIG. 1 and FIG. 2B, step S102 is performed, and a channel material layer 102 is formed on the substrate 100. In some embodiments, substantially the whole surface of the substrate 100 may be covered by the channel material layer 102. In other words, the channel material layer 102 may span in the first region R1, the second region R2 and the third region R3. In some embodiments, a material of the channel material layer 102 may include a group III nitride material or a group III-V semiconductor material. For instance, the material of the channel material layer 102 may include GaN. A formation method of the channel material layer 102 may include an epitaxial process. In addition, a thickness of the channel material layer 102 may range from 100 nm to 900 nm. In some embodiments, a top surface of the channel material layer 102 may be a polar plane. For instance, the top surface of the channel material layer 102 may be a {0001} plane. As such, a hetero-junction formed by the channel material layer 102 and another group III nitride material or group III-V semiconductor compound may induce spontaneous polarization or piezoelectric polarization, such that two dimensional electron gas (2DEG) or two dimensional hole gas (2DHG) with high carrier concentration may be formed at the hetero-junction.

In some embodiments, before the channel material layer 102 is formed, a buffer layer (not shown) may be formed on the substrate 100. As such, the buffer layer may be located between the substrate 100 and the channel material layer 102. In some embodiments, substantially the whole surface of the substrate 100 may be covered by the buffer layer. In other words, the buffer layer may span in the first region R1, the second region R2 and the third region R3. In some embodiments, a material of the buffer layer may include a group III nitride material or a group III-V semiconductor compound. For instance, the material of the buffer layer may include InAlGaN, AlGaN, AlnN, InGaN, AlN, GaN or combinations thereof. A formation method of the buffer layer may include an epitaxial process. By disposing the buffer layer, a stress caused by a lattice constant mismatch and/or difference of coefficient of thermal expansion between the substrate 100 and the channel material layer 102 may be reduced.

Figure 2C:
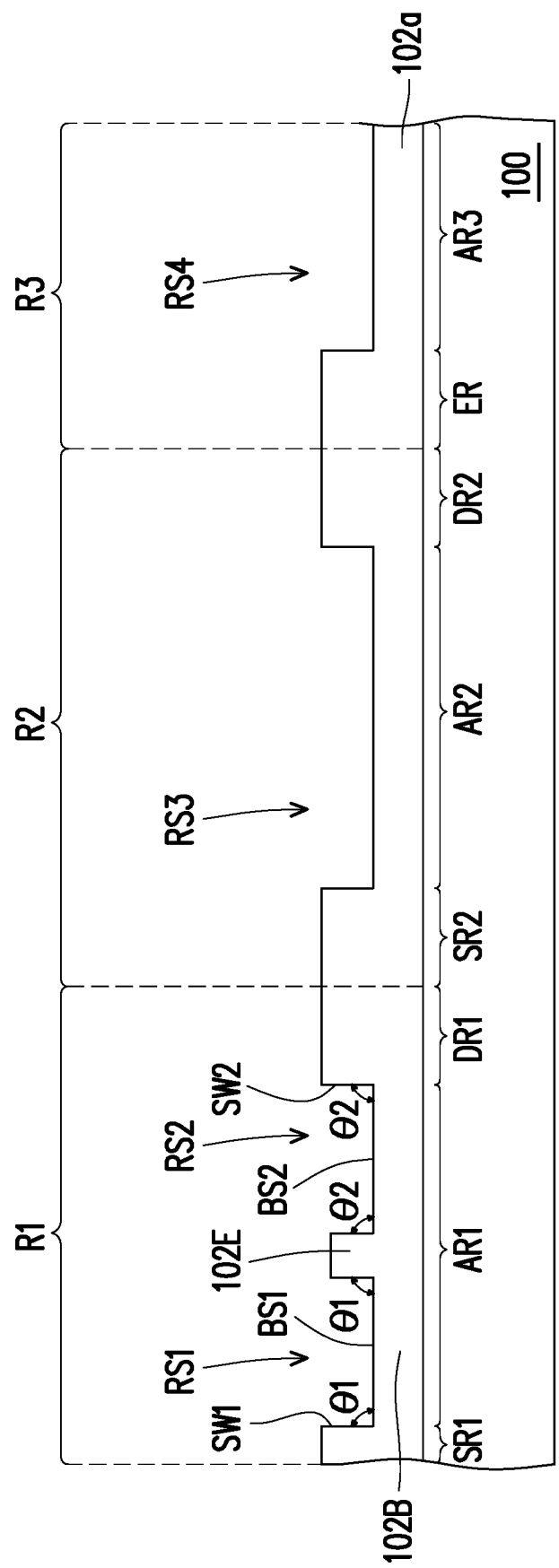

Referring to FIG. 1 and FIG. 2C, step S104 is performed, and a portion of the channel material layer 102 that is located within the first region R1 is patterned to form a channel layer 102a. In some embodiments, a method of patterning the channel material layer 102 includes removing some portions of the channel material layer 102 within the first region R1 from the surface of the channel material layer 102. As such, a top portion of the formed channel layer 102a has a first recess RS1 and a second recess RS2. The first recess RS1 and the second recess RS2 are located within the first region R1, and adjacent to each other. In addition, the first recess RS1 and the second recess RS2 may define an active region AR1, a drain region DR1 and a source region SR1 of the transistor formed within the first region R1 in the following steps (e.g., the transistor T1 shown in FIG. 2G). Specifically, portions of the channel layer 102a lying under the first recess RS1 and the second recess R2, and a portion of the channel layer 102a located between the first recess RS1 and the second recess RS2 are within the active region AR1. A portion of the channel layer 102a located between the second recess RS2 and an interface of the first region R1 and the second region R2 is within the drain region DR1, and a portion of the channel layer 102a located between the first recess RS1 and another boundary of the first region R1 is within the source region SR1. However, locations of the drain region DR1 and the source region SR1 may be exchanged, the present invention is not limited to the locations of the drain region DR1 and the source region SR1. In some embodiments, an interval between the first recess RS1 and the second recess RS2 may range from 0.5 μm to 5 m. Widths of the first recess RS1 and the second recess RS2 may respectively range from 1 μm to 20 μm. In addition, depths of the first recess RS1 and the second recess RS2 may respectively range from 50 μm to 500 μm.

By forming the first recess RS1 and the second recess RS2, the surface of the channel layer 102a is no longer all polar. Instead, the channel layer 102a includes polar planes and non-polar planes substantially perpendicular to the polar planes. In some embodiments, within the active region AR1, the channel layer 102a includes polar planes and non-polar planes. Specifically, a sidewall SW1 of the first recess RS1 is a non-polar plane, and a bottom surface BS1 of the first recess RS1 is a polar plane. For instance, the sidewall SW1 of the first recess RS1 is a {10-10} plane, and the bottom surface BS1 of the first recess RS1 is a {0001} plane. Similarly, a sidewall SW2 of the second recess RS2 is a non-polar plane (e.g., a {10-10} plane), and a bottom surface BS2 of the second recess RS2 is a polar plane (e.g., a {0001} plane). Moreover, surfaces of portions of the channel layer 102a outside the first recess RS1 and the second recess RS2 are also polar planes. For instance, a surface of a portion of the channel layer 102a located between the first recess RS1 and the second recess RS2 is a polar plane, such as a {0001} plane. In some embodiments, the sidewall SW1 and the bottom surface BS1 of the first recess RS1 are substantially perpendicular to each other, and the sidewall SW2 and the bottom surface BS2 of the second recess RS2 are substantially perpendicular to each other. In alternative embodiments, an angle θ1 between the sidewall SW1 and the bottom surface BS1 and an angle θ2 between the sidewall SW2 and the bottom surface BS2 respectively range from 70° to 90°.

Viewing from another angle, a portion of the channel layer 102a within the active region AR1 has a body portion 102B and a protruding portion 102E. The body portion 102B extends along a direction substantially parallel to the surface of the substrate 100, and the protruding portion 102E protrudes from the body portion 102B along a direction substantially normal to the surface of the substrate 100. A surface of the body portion 102B is a polar plane. On the other hand, a top surface of the protruding portion 102E is a polar plane, and a sidewall of the protruding portion 102E is a non-polar plane. In some embodiments, a height of the protruding portion 102E may range from 50 μm to 500 m.

In some embodiments, portions of the channel material layer 102 within the second region R2 and the third region R3 may be patterned while patterning the portion of the channel material layer 102 within the first region R1. In some embodiments, a portion of the channel material layer 102 within the second region R2 may be removed from the surface of the channel material layer 102, so as to form a third recess RS3. As such, an active region AR2, a drain region DR2 and a source region SR2 of the transistor formed within the second region R2 in the following steps (e.g., the transistor T2 shown in FIG. 2G) may be defined. A portion of the channel layer 102a lying under the third recess RS3 is within the active region AR2. A portion of the channel layer 102a located between the third recess RS3 and an interface of the second region R2 and the third region R3 is within the drain region DR2, and a portion of the channel layer 102a located between the third recess R3 and an interface of the first region R1 and the second region R2 is within the source region SR2. However, locations of the drain region DR2 and the source region SR2 may be exchanged, the present invention is not limited the locations of the drain region DR2 and the source region SR2. In addition, a portion of the channel material layer 102 within the third region R3 may be removed from the surface of the channel material layer 102, so as to form a fourth recess RS4. The fourth recess RS4 may extend to a boundary of the third region R3 opposite to the second region R2. By forming the fourth recess RS4, an active region AR3 and an electrode region ER of the diode formed within the third region R3 in the following steps (e.g., the diode D shown in FIG. 2G) may be defined. A portion of the channel layer 102a overlapped with the fourth recess RS4 is within the drain region DR4, and a portion of the channel layer 102a between the fourth recess RS4 and an interface of the second region R2 and the third region R3 is within the source region SR4. As similar to the first recess RS1 and the second recess RS2, bottom surfaces of the third recess RS3 and the fourth recess RS4 may be polar planes, and sidewalls of the third recess RS3 and the fourth recess RS4 may be non-polar planes. In addition, as compared to the active region AR1 within the first region R1, surfaces of the active regions AR2 and AR3 within the second region R2 and the third region R3 are substantially planar, and are all polar planes.

Figure 2D:
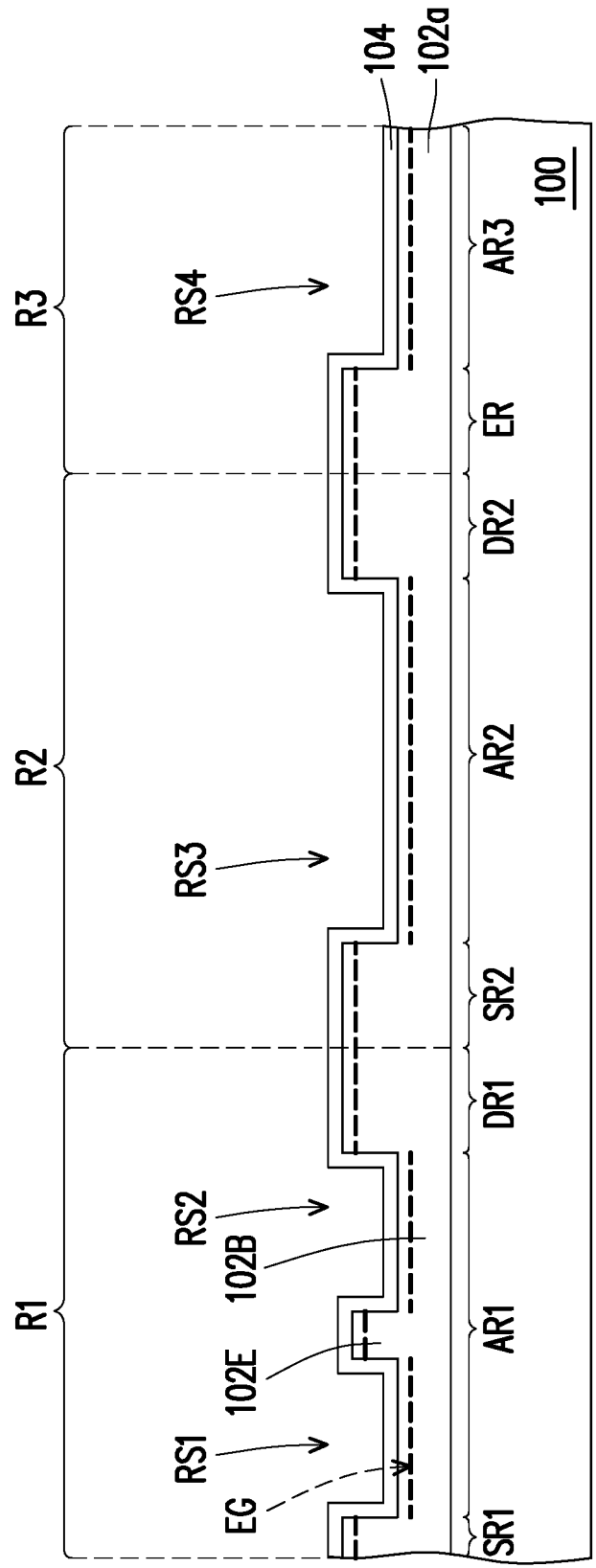

Referring to FIG. 1 and FIG. 2D, step S106 is performed, and a barrier layer 104 is conformally formed on the channel layer 102a. In some embodiments, substantially the whole surface of the channel layer 102a is covered by the barrier layer 104. In other words, the barrier layer 104 may span in the first region R1, the second region R2 and the third region R3. In some embodiments, a material of the barrier layer 104 may include a group III nitride material or a group III-V semiconductor compound. For instance, the material of the barrier layer 104 may include InAlGaN, AlGaN, AlInN, AlN or combinations thereof. In some embodiments, the material of the barrier layer 104 is $Al_xGa_{1-x}N$, of which x ranges from 0.1 to 0.9. In other embodiments, the material of the barrier layer 104 is $In_yAl_{1-y}GaN$, of which y ranges from 0.1 to 0.9. In some embodiments, a method of forming the barrier layer 104 includes an epitaxial process. In addition, a thickness of the barrier layer 104 may be greater than 10 nm, such as 10 nm to 100 nm. As such, a hetero-junction formed by the barrier layer 104 and the portions of the channel layer 102a having polar planes may induce two dimensional electron gas EG by spontaneous polarization and piezoelectric polarization. The two dimensional electron gas EG may be located in the channel layer 102a, and close to an interface of the channel layer 102a and the barrier layer 104. On the other hand, the hetero-junction formed by the barrier layer 104 and the portions of the channel layer 102a having non-polar planes will not induce two dimensional electron gas. In other words, the two dimensional electron gas EG only extends along the polar planes of the channel layer 102a, and is absent at the non-polar planes. For instance, in the active region AR1 within the first region R1, the two dimensional electron gas EG extends along the surface of the body portion 102B of the channel layer 102a and the top surface of the protruding portion 102E, and is cut off at the sidewall of the protruding portion 102E. This discontinuous two dimensional electron gas EG can be regarded as a discontinuous conductive channel while a proper bias voltage is not applied. A continuous conductive channel can be formed only if a proper bias voltage is applied. Therefore, the transistor formed within the first region R1 thereafter may be an enhancement mode HEMT, which is also known as a normally-off HEMT. In addition, the enhancement mode HEMT has a first conductive type (e.g., N type).

In the active region AR2 within the second region R2, the two dimensional electron gas EG continuously extends along the surface of the channel layer 102a. In some embodiments, the transistor formed within the second region R2 in the following steps may be a depletion mode HEMT, which is also known as a normally-on HEMT. In addition, the depletion mode HEMT may have a first conductive type (e.g., N type). Similarly, in the active region AR3 within the third region R3, the two dimensional electron gas EG also continuously extends along the surface of the channel layer 102a. In some embodiments, a schottky diode may be formed within the third region R3.

In alternative embodiments, the barrier layer 104 is doped with dopants having a second conductive type (e.g., P type). For instance, the dopants of the second conductive type may be Mg. As such, the hetero-junction formed by the barrier layer 104 and the portions of the channel layer 102a having polar planes may induce two dimensional hole gas (not shown) by spontaneous polarization and piezoelectric polarization. Location of the two dimensional hole gas is the same as the location of the two dimensional electron gas EG as shown in FIG. 2D, but the charges carried by the two dimensional hole gas is different from the charges carried by the two dimension electron gas EG. In these embodiments, the transistors formed within the first region R1 and the second region R2 may have a second conductive type (e.g., P type).

Figure 2E:
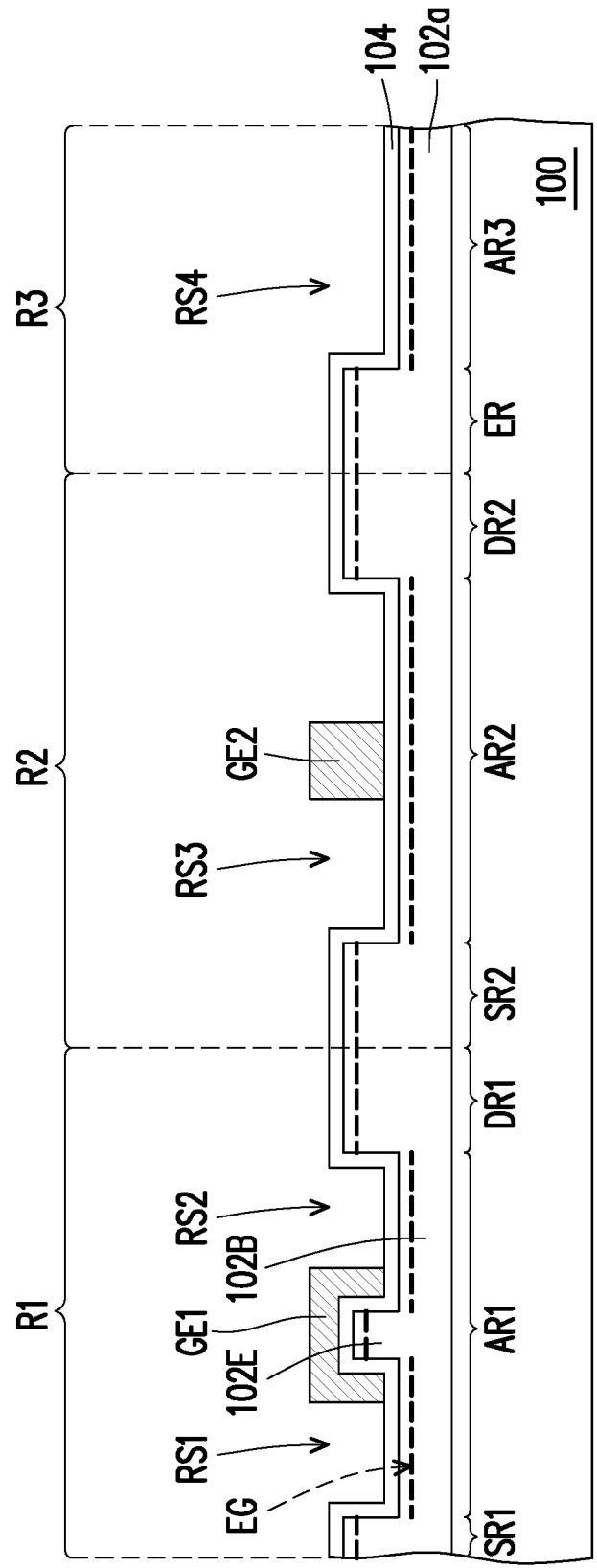

Referring to FIG. 1 and FIG. 2E, step S108 is performed, and a first gate electrode GE1 is formed on the barrier layer 104 within the first region R1. In some embodiments, the first gate electrode GE1 is formed on the protruding portion 102E of the channel layer 102a. In some embodiments, the first gate electrode GE1 further extends onto the sidewall of the protruding portion 102E, and may partially cover the top surface of the body portion 102B of the channel layer 102a. In these embodiments, the first gate electrode GE1 further extends into the first recess RS1 and the second recess RS2. As such, a non-polar plane and some of the polar planes of the channel layer 102a are covered by the first gate electrode GE1. The two dimensional electron gas EG beneath the first gate electrode GE1 is not continuous when the first gate electrode GE1 does not receive a bias voltage, so as to be functioned as a normally-off conductive channel. A continuous conductive channel is formed only if a proper bias voltage is applied to the first gate electrode GE1. In some embodiments, a material of the first gate electrode GE1 may include a metal, a metal nitride (e.g., Ta, TaN, Ti, TiN, W, Pd, Ni, Au, Al or combinations thereof), a metal silicide (e.g., $WSi_x$) or other materials that may form a schottky contact with the barrier layer 104. A method of forming the first gate electrode GE1 may include a chemical vapor deposition method, a physical vapor deposition method (e.g., sputtering or the like) or combinations thereof. In some embodiments, a thickness of the first gate electrode GE1 may range from 0.3 nm to 1000 nm.

In some embodiments, step S110 is performed, and a second gate electrode GE2 is formed on the barrier layer 104 within the second region R2. In some embodiments, the second gate electrode GE2 is disposed in the active region AR2, and located on the bottom surface of the third recess RS3. The bottom surface of the third recess RS3 is a polar plane, and the two dimensional electron gas RG continuously extends along the bottom surface of the third recess RS3. In other words, the two dimensional electron gas EG beneath the second gate electrode GE2 can be continuous even though the second gate electrode GE2 does not receive a bias voltage, so as to be functioned as a normally-on conductive channel. The second gate electrode GE2 is formed by a material that is able to form a schottky contact with the barrier layer 104. In some embodiments, the first gate electrode GE1 and the second gate electrode GE2 may be formed by the same material. In addition, in some embodiments, step S108 and step S110 may be performed simultaneously, so as to form the first gate electrode GE1 and the second gate electrode GE2 at the same time. In other embodiments, a material of the second gate electrode GE2 may be different from a material of the first gate electrode GE1. Moreover, the first gate electrode GE1 and the second gate electrode GE2 may be formed at different steps.

Figure 2F:
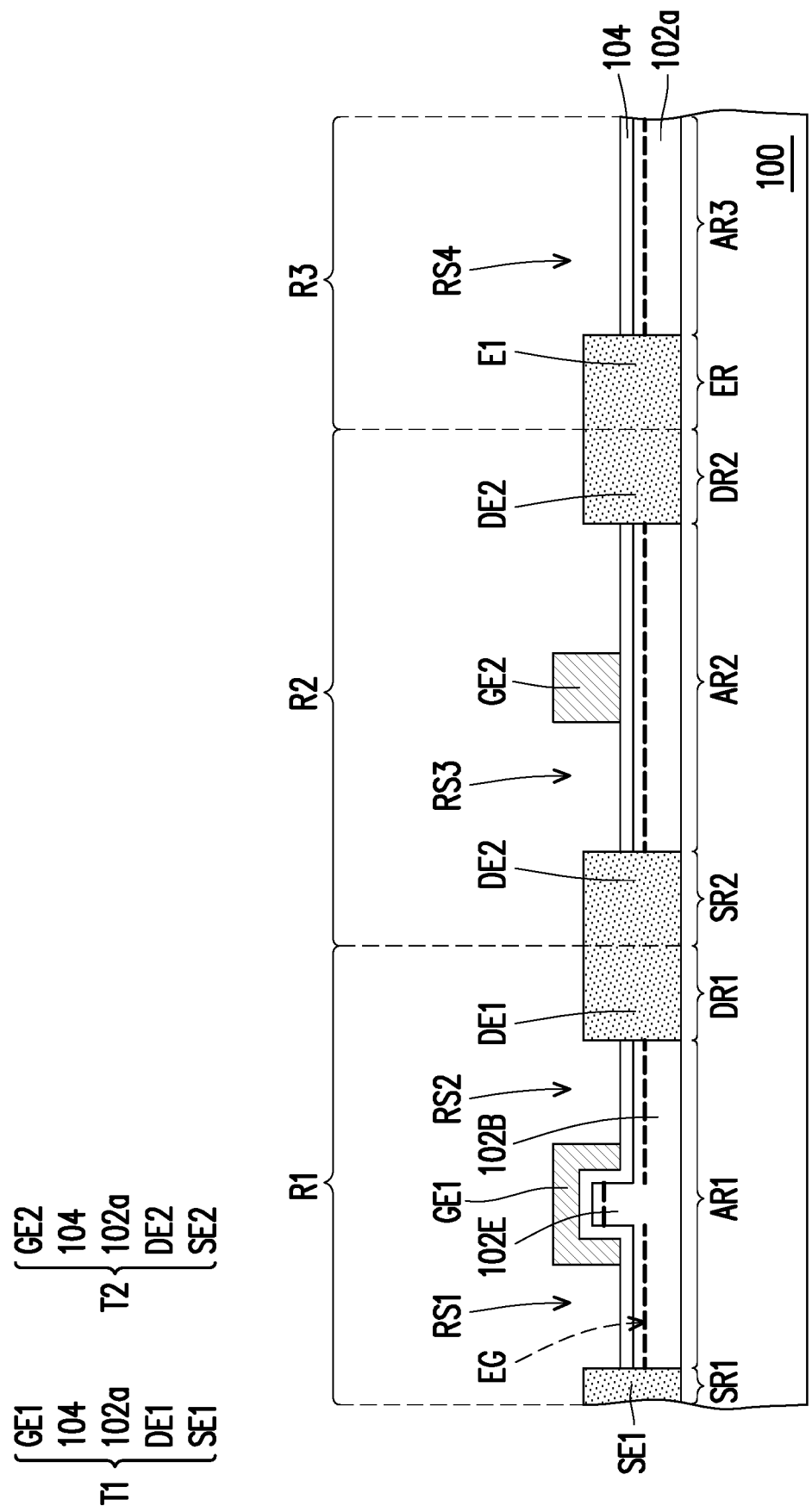

Referring to FIG. 1 and FIG. 2F, step S112 is performed, and a first drain electrode DE1 and a first source electrode SE1 are formed within the first region R1. The first drain electrode DE1 and the first source electrode SE1 are located at opposite sides of the first gate electrode GE1. In addition, the first drain electrode DE1 and the first source electrode SE1 may form an ohmic contact with the channel layer 102a and/or the barrier layer 104. In some embodiments, dopants may be implanted into portions of the barrier layer 104 and the underlying channel layer 102a located within the drain region DR1 and the source region SR1, so as to form the first drain electrode DE1 and the first source electrode SE1. In some embodiments, the dopants for forming the first drain electrode DE1 and the first source electrode SE1 may include Si, W or the like. Doping concentrations of the first drain electrode DE1 and the first source electrode SE1 may respectively range from $10^{19}$ cm$^{-3}$ to $5 \times 10^{20}$ cm$^{-3}$. In some embodiments, the first drain electrode DE1 and the first source electrode SE1 may penetrate through the channel layer 102a along a direction substantially normal to the surface of the substrate 100. Up to here, a transistor T1 has been formed within the first region R1. The transistor T1 includes a portion of the channel layer 102a and a portion of the barrier layer 104 that are located within the first region R1, and includes the first gate electrode GE1, the first drain electrode DE1 and the first source electrode SE1. The transistor T1 may be an enhancement mode HEMT (also known as a normally-off HEMT), and has the first conductive type (e.g., N type).

A step S114 is performed, and a second drain electrode DE2 and a second source electrode SE2 are formed within the second region R2. The second drain electrode DE2 and the second source electrode SE2 are located at opposite sides of the second gate electrode GE2. In addition, the second drain electrode DE2 and the second source electrode SE2 may form an ohmic contact with the channel layer 102a and/or the barrier layer 104. In some embodiments, dopants may be implanted into portions of the barrier layer 104 and the underlying channel layer 102a located within the drain region DR2 and the source region SR2, so as to form the second drain electrode DE2 and the second source electrode SE2. In some embodiments, the first drain electrode DE1, the first source electrode SE1, the second drain electrode DE2 and the second source electrode SE2 may be formed by the same dopants with substantially the same doping concentration. In some embodiments, the second drain electrode DE2 and the second source electrode SE2 may penetrate through the channel layer 102a along a direction substantially normal to the surface of the substrate 100. Up to here, a transistor T2 has been formed within the second region R2. The transistor T2 includes a portion of the channel layer 102a and a portion of the barrier layer 104 that are located within the second region R2, and includes the second gate electrode GE2, the second drain electrode DE2 and the second source electrode SE2. The transistor T2 may be a depletion mode HEMT (also known as a normally-on HEMT), and has the first conductive type (e.g., N type).

Step S116 is performed, and a first electrode E1 is formed within the third region R3. In some embodiments, dopants may be implanted into portions of the barrier layer 104 and the underlying channel layer 102a located within the electrode region ER, so as to form the first electrode E1. In some embodiments, the first electrode E1, the first drain electrode DE1, the first source electrode SE1, the second drain electrode DE2 and the second source electrode SE2 may be formed by the same dopants with substantially the same doping concentration. In some embodiments, the first electrode E1 may penetrate through the channel layer 102a along a direction substantially normal to the surface of the substrate 100. The first electrode E1 may be functioned as one of the electrodes of the schottky diode formed within the third region R3 in the following steps (e.g., the diode D shown in FIG. 2G).

In some embodiments, step S112, step S114 and step S116 may be performed simultaneously, so as to form the first drain electrode DE1, the first source electrode SE1, the second drain electrode DE2, the second source electrode SE2 and the first electrode E1. However, those skilled in the art may adjust the formation order and process parameters of these electrodes by process requirements, the present invention is not limited thereto.

In alternative embodiments, a source electrode and a drain electrode of the transistor T1 may be formed over the barrier layer 104 at opposite sides of the first gate electrode GE1. Similarly, a source electrode and a drain electrode of the transistor T2 may be formed over the barrier layer 104 at opposite sides of the second gate electrode GE2. In these embodiments, the source and drain electrodes of the transistors T1 and T2 may be formed by a chemical vapor deposition method or a physical vapor deposition method (e.g., sputtering). In addition, a material of the source and drain electrodes may include a metal, a metal nitride, a metal silicide or a material that is able to form an ohmic contact with the barrier layer 104.

Figure 2G:
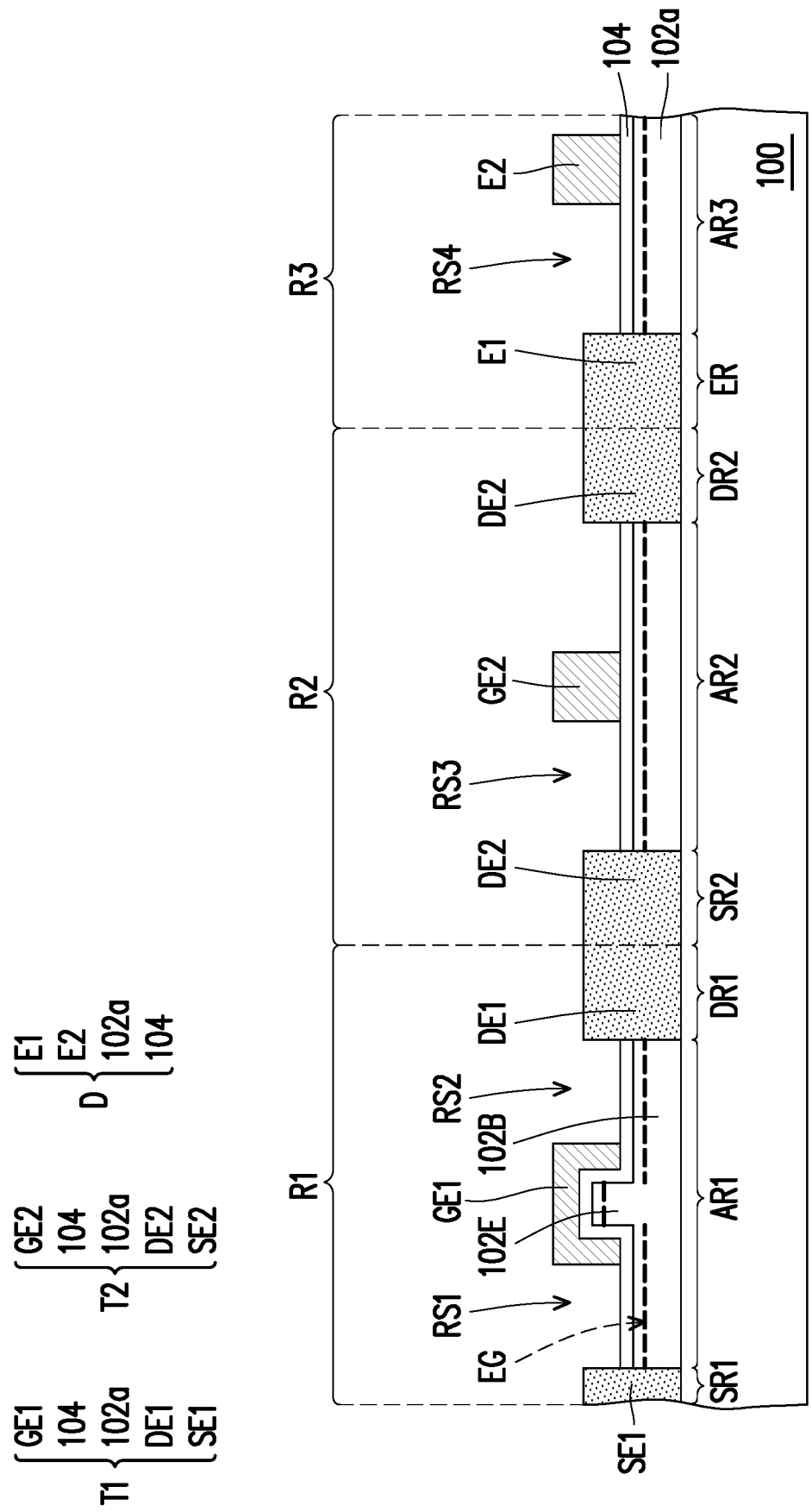

Referring to FIG. 1 and FIG. 2G, step S118 is performed, and a second electrode E2 is formed on the barrier layer 104 within the third region R3. The second electrode E2 is located aside the first electrode E1, and located within the active region AR3. In some embodiments, the second electrode E2 is disposed in the fourth recess RS4 of the channel layer 102a, and overlapped with the polar plane of the channel layer 102a. The second electrode E2 may be composed by a material that is able to form a schottky contact with the barrier layer 104. In some embodiments, the material of the second electrode E2 may include Ni, TiN, Pd, Pt, Cr, Mo, W, the like or combinations thereof. A method of forming the second electrode E2 may include a chemical vapor deposition method, a physical vapor deposition method (e.g., sputtering) or a combination thereof. In some embodiments, a thickness of the second electrode E2 may range from 0.5 nm to 1000 nm. Up to here, a diode D is formed within the third region R3. The diode D may be a schottky diode, and includes a portion of the channel layer 102a and a portion of the barrier layer 104 that are located within the third region R3, and includes the first electrode E1 and the second electrode E2.

Figure 2H:
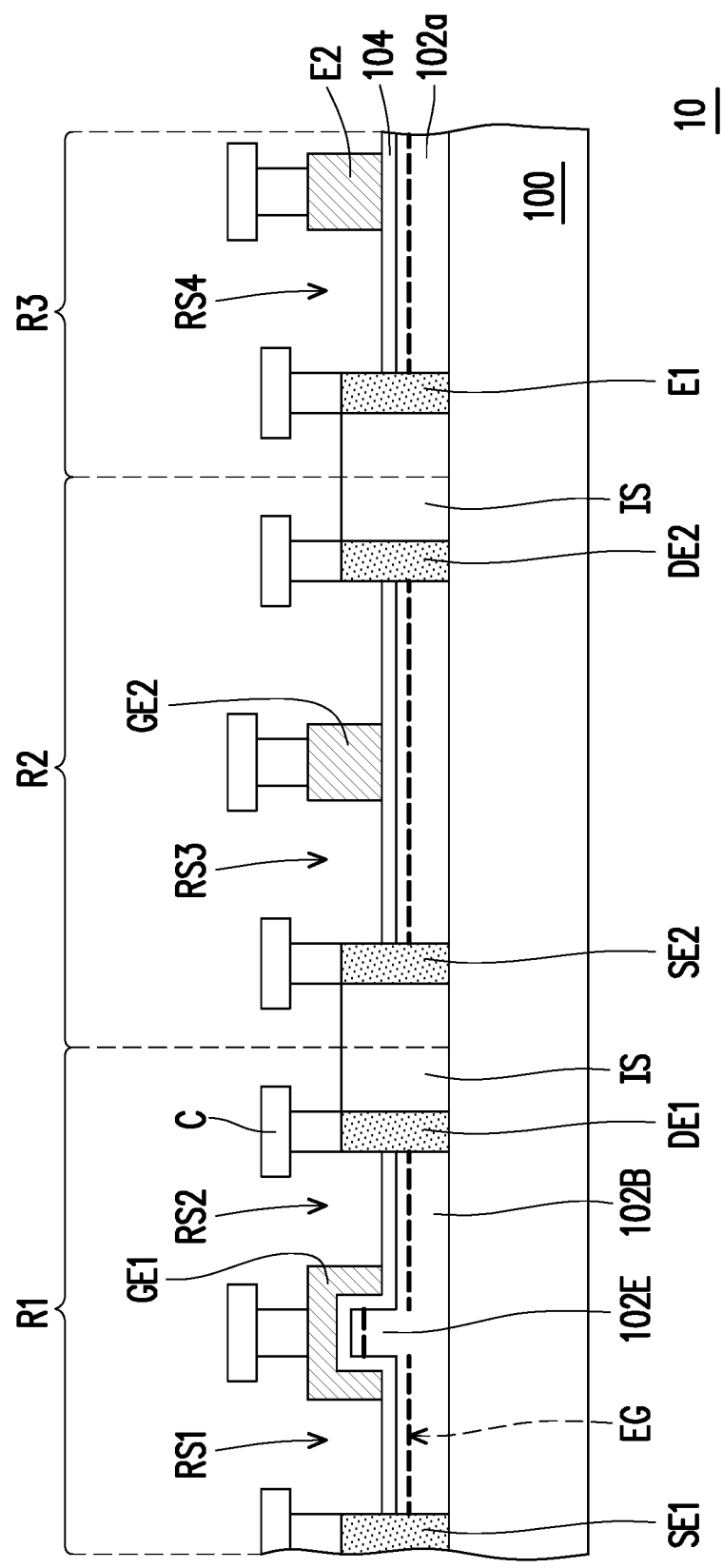

Referring to FIG. 1 and FIG. 2H, step S120 is performed, and an isolation structure IS and an interconnection structure C are formed. The transistor T1, the transistor T2 and the diode D are electrically isolated from one another by the isolation structure IS. In some embodiments, a method of forming the isolation structure IS includes removing a portion of the first drain electrode DE1 and a portion of the second source electrode SE2 at a vicinity of the interface of the first region R1 and the second region R2, and filling back with an insulating material. Similarly, a portion of the second drain electrode DE2 and a portion of the first electrode E1 at a vicinity of the interface of the second region R2 and the third region R3, and the insulating material is filled back. As such, the isolation structure IS is formed between the transistor T1 and the transistor T2, and between the transistor T2 and the diode D. In some embodiments, a material of the isolation structure IS may include silicon oxide, silicon nitride, the like or combinations thereof. In alternative embodiments, the isolation structure IS may be formed by a method of ion implantation. Dopants used for the ion implantation may include Ar, N2 or the like.

In these embodiments, the step of removing the portions of the first drain electrode DE1, the second source electrode SE2, the second drain electrode DE2 and the first electrode E1 may be omitted. On the other hand, the interconnection structure C is electrically connected with electrodes of the transistor T1, the transistor T2 and the diode D. In some embodiments, a method of forming the interconnection structure C may include forming one or more insulating layers (not shown) over the substrate 100, then forming vias and/or trenches in the insulating layer(s) to expose the electrodes of the transistor T1, the transistor T2 and the diode D. Thereafter, a conductive material is formed in these vias and/or trenches, so as to form the interconnection structure C.

So far, the HEMT device 10 of some embodiments of the present invention has been formed. The HEMT device 10 may include the transistor T1, the transistor T2 and the diode D. The transistor T1 and the transistor T2 may be HEMTs. In some embodiments, the transistor T1 is an enhancement mode HEMT, and the transistor T2 is a depletion mode HEMT. In addition, both of the transistor T1 and the transistor T2 have the first conductive type (e.g., N type) or the second conductive type (e.g., P type). In alternative embodiments, both of the transistor T1 and the transistor T2 are enhancement mode HEMTs, except that a conductive type of the transistor T1 (e.g., N type) is complementary to a conductive type of the transistor T2 (e.g., P type). In addition, the diode D may be a schottky diode.

Figure 3:
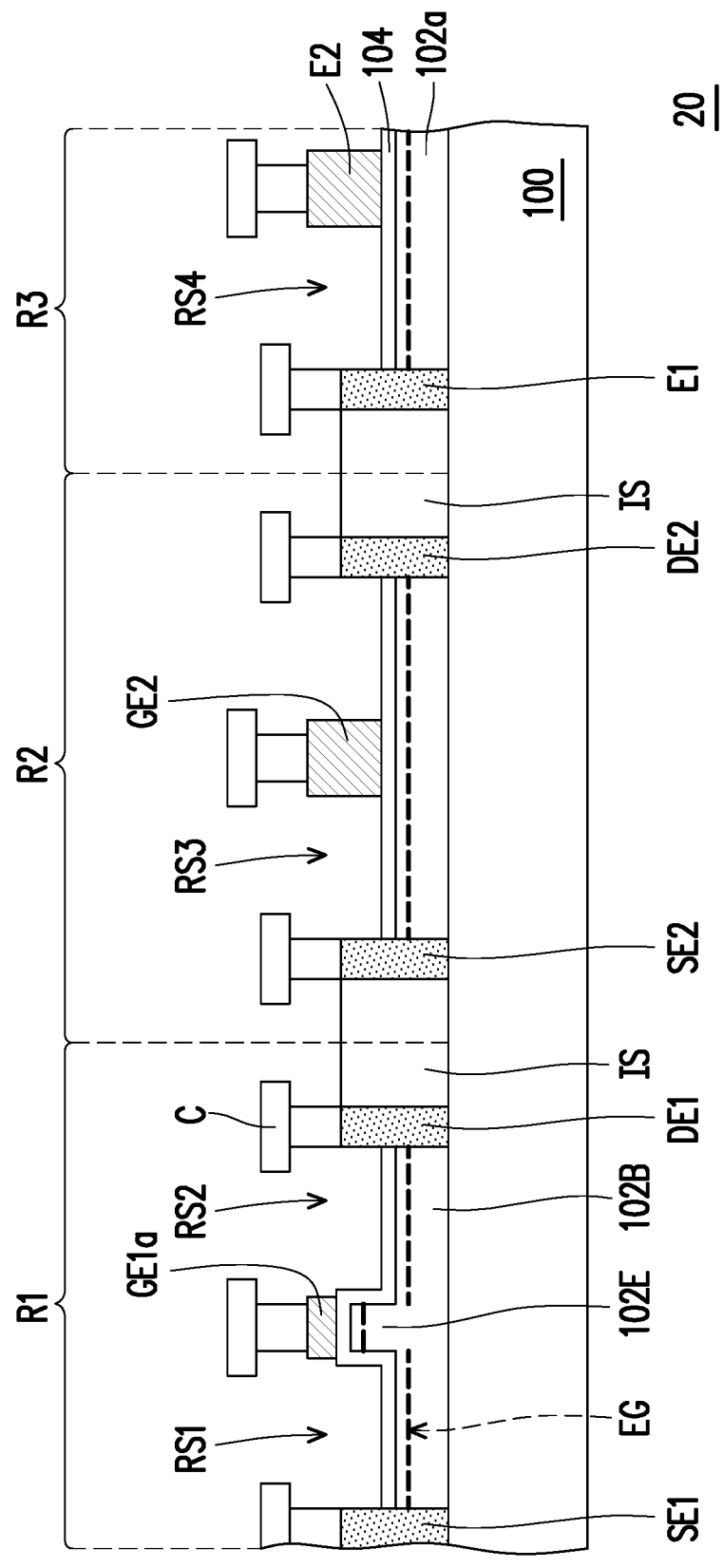
FIG. 3 is a cross-sectional view illustrating a HEMT device according to some embodiments of the present invention.

FIG. 3 is a cross-sectional view illustrating a HEMT device 20 according to some embodiments of the present invention.

Referring to FIG. 2H and FIG. 3, the HEMT device 20 shown in FIG. 3 is similar to the HEMT device 10 shown in FIG. 2H, except that the first gate electrode GE1a of the HEMT device 20 is different from the first gate electrode GE1 of the HEMT device 10. Specifically, the first gate electrode GE1a of the HEMT device 20 is also disposed on the protruding portion 102E of the channel layer 102a, but does not extend onto the sidewall of the protruding portion 102E. In other words, the first gate electrode GE1a does not extend into the first recess RS1 and the second recess RS2. In these embodiments, the first gate electrode GE1a merely covers the polar plane of the protruding portion 102E of the channel layer 102a, but does not cover the non-polar plane of the protruding portion 102E of the channel layer 102a. As compared to the embodiments shown in FIG. 2H, a distance between the first gate electrode GE1a of FIG. 3 and the cut-off section of the two dimensional electron gas EG (close to the non-polar plane of the protruding portion 102E of the channel layer 102a) becomes longer. Therefore, a higher gate voltage is required to form a continuous conductive channel in the channel layer 102a when the transistor T1 is turned on.

Figure 4A:
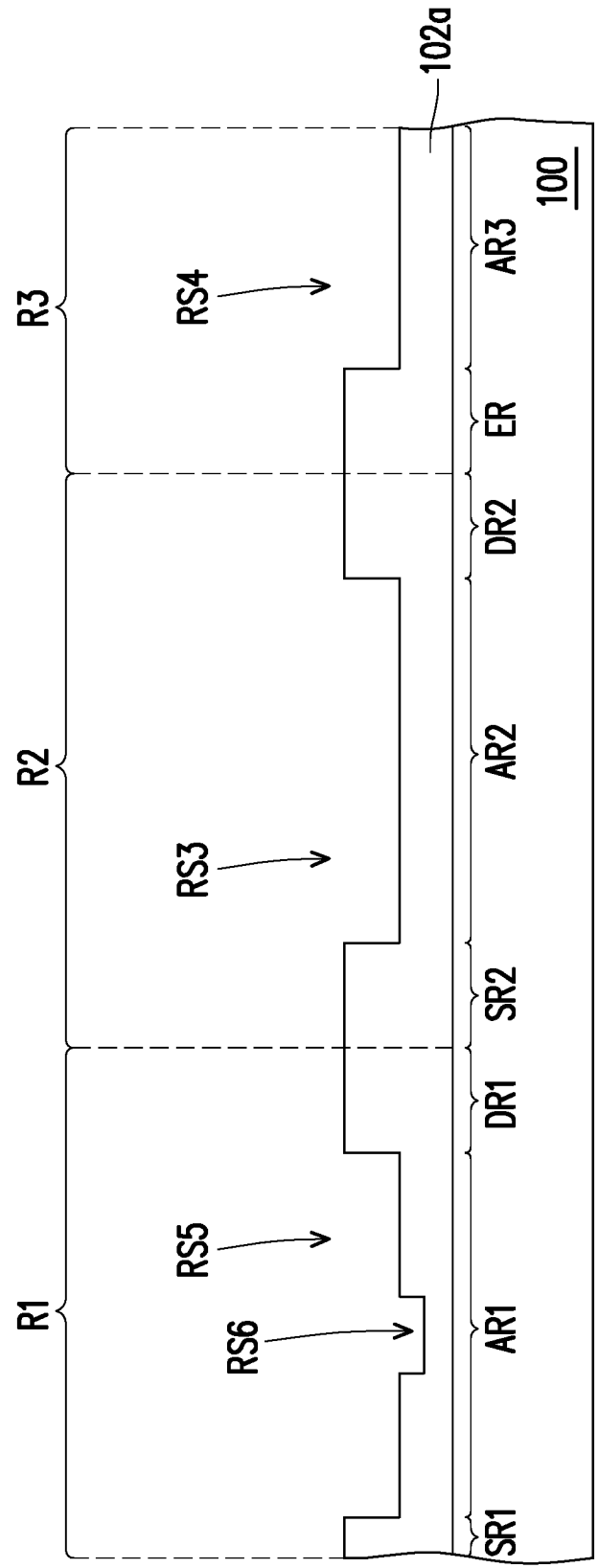
FIG. 4A and FIG. 4B are cross-sectional views illustrating structures at some stages of a manufacturing method of a HEMT device according to some embodiments of the present invention.
Figure 4B:
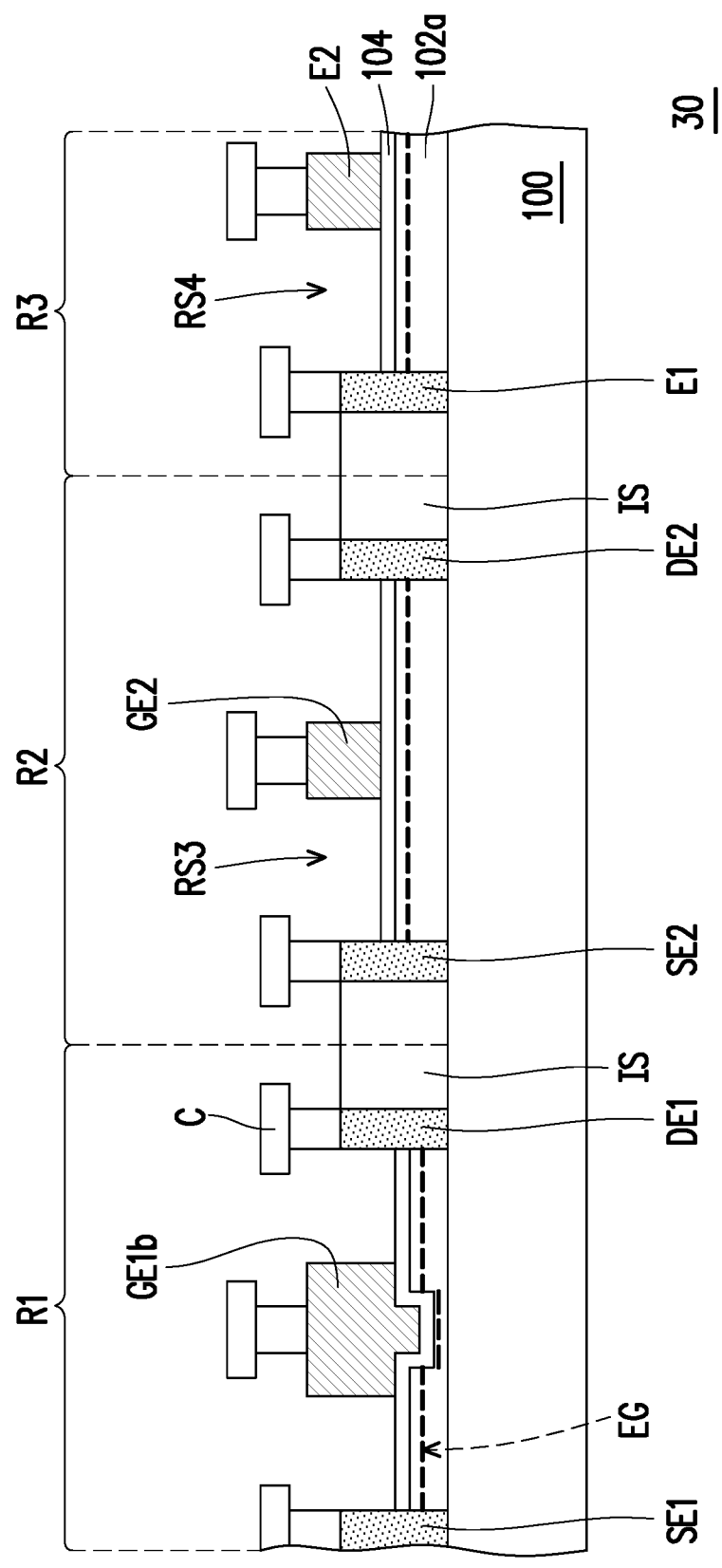

FIG. 4A and FIG. 4B are cross-sectional views illustrating structures at some stages of a manufacturing method of a HEMT device 30 according to some embodiments of the present invention. The embodiments shown in FIG. 4A and FIG. 4B are similar to the embodiments shown in FIG. 1 and FIG. 2A through FIG. 2H, only the differences therebetween will be described, the same or the like part will not be repeated again.

Referring to FIG. 1, FIG. 2B and FIG. 4A, in step S104, a method of patterning the channel material layer 102 includes removing portions of the channel material layer 102 located within the first region R1 from the surface of the channel material layer 102, to form a recess RS5 and a recess RS6 at a top portion of the formed channel layer 102a. The recess RS5 and the recess RS6 are communicated with each other, and the recess RS6 is located beneath the recess RS5. In some embodiments, the recess RS5 defines the active region AR1, the drain region DR1 and the source region SR1 of the transistor formed within the first region R1 in the following steps (e.g., the transistor T1 shown in FIG. 4B). By disposing the recess RS6, a non-polar plane of the channel layer 102a can be exposed. Specifically, the sidewall of the recess RS6 is a non-polar plane (e.g., {10-10} plane), and the bottom surface of the recess RS6 is a polar plane (e.g., {0001} plane). In some embodiments, the sidewall and the bottom surface of the recess RS6 are substantially perpendicular with each other. In other embodiments, an angle between the sidewall and the bottom surface of the recess RS6 may range from 70° to 90°.

Referring to FIG. 1 and FIG. 4B, step S106 through step S120 may be subsequently performed, to form a HEMT device 30. The first gate electrode GE1b is formed in the recess RS6, and covers a polar plane and a non-polar plane of the channel layer 102a. In some embodiments, the first gate electrode GE1b further extends onto the bottom surface of the recess RS5. Within the active region AR1 in the first region R1, a hetero-junction formed by the barrier layer 104 and portions of the channel layer 102a having polar planes may induce the two dimensional electron gas EG (or two dimensional hole gas). On the other hand, a hetero-junction formed by the barrier layer 104 and a portion of the channel layer 102a having a non-polar plane does not form any two dimensional electron gas (or two dimensional hole gas). Such discontinuous two dimensional electron gas EG (or two dimensional hole gas) can be regarded as a discontinuous conductive channel while a proper bias voltage is not applied. A continuous conductive channel can be formed only if a proper bias voltage is applied. Accordingly, as similar to the embodiments shown in FIG. 2H, the transistor T1 form within the first region R1 shown in FIG. 4B is also an enhancement mode HEMT, which is also referred as a normally-off HEMT.

As above, the HEMT of the embodiments in the present invention has a three dimensional channel structure. This three dimensional channel structure has a polar plane and a non-polar plane. A hetero-junction formed by the barrier layer and portions of the channel layer having polar planes may induce the two dimensional electron gas (or two dimensional hole gas) even if a bias voltage is not applied. On other hand, a hetero-junction formed by the barrier layer and a portion of the channel layer having a non-polar plane does not form any two dimensional electron gas (or two dimensional hole gas). In other words, such discontinuous two dimensional electron gas can be regarded as a discontinuous conductive channel while a proper bias voltage is not applied. A continuous conductive channel can be formed only if a proper bias voltage is applied. Therefore, this HEMT can be an enhancement mode HEMT, which is also referred as a normally-off HEMT. Regarding a threshold voltage of HEMT, the enhancement mode HEMT is beneficial for circuit design. In some embodiments, the enhancement mode HEMT, the depletion mode HEMT and the schottky diode may be integrated into the HEMT device, which forms a basic logic integrated circuit.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A high electron mobility transistor device, comprising:
a channel layer, disposed on a substrate, wherein a surface of a portion of the channel layer located within a first region of the high electron mobility transistor device comprises a polar plane and a non-polar plane;
a barrier layer, conformally disposed on the channel layer;
a first gate electrode, disposed on the barrier layer and extending along the polar plane of the channel layer within the first region; and
a first drain electrode and a first source electrode, disposed within the first region, and located at opposite sides of the first gate electrode,
wherein the channel layer comprises a body portion and a protruding portion, the protruding portion protrudes from the body portion along a direction substantially normal to a surface of the substrate, a sidewall of the protruding portion is the non-polar plane, and a top surface of the protruding portion is a portion of the polar plane.

2. The high electron mobility transistor device of claim 1, wherein the polar plane and the non-polar plane are substantially perpendicular with each other.

3. The high electron mobility transistor device of claim 1, wherein the first gate electrode covers the top surface of the protruding portion.

4. The high electron mobility transistor device of claim 1, wherein the first gate electrode covers the top surface and the sidewall of the protruding portion.

5. The high electron mobility transistor device of claim 1, wherein a top surface of a portion of the channel layer located within a second region of the high electron mobility transistor device comprises a polar plane, and the high electron mobility transistor device further comprises:
a second gate electrode, disposed on a portion of the barrier layer located within the second region; and
a second drain electrode and a second source electrode, disposed within the second region, and located at opposite sides of the second gate electrode.

6. The high electron mobility transistor device of claim 1, wherein a top surface of a portion of the channel layer located within a third region of the high electron mobility transistor device comprises a polar plane, and the high electron mobility transistor device further comprises:
a first electrode, disposed in the channel layer and the barrier layer, and located within the third region; and
a second electrode, disposed on a portion of the barrier layer located within the third region, and located aside the first electrode.

7. The high electron mobility transistor device of claim 1, wherein the channel layer is entirely covered by the barrier layer.

8. A manufacturing method of a high electron mobility transistor device, comprising:
forming a channel material layer on a substrate;
patterning a portion of the channel material layer located within a first region of the high electron mobility transistor device, so as to form a channel layer, wherein a surface of a portion of the channel layer within the first region comprises a polar plane and a non-polar plane, a method for patterning the portion of the channel material within the first region comprises removing portions of the channel material layer from the surface of the channel material layer, such that a top portion of the channel layer has a first recess and a second recess adjacent with each other, wherein sidewalls of the first recess and the second recess are portions of the non-polar plane, and bottom surfaces of the first recess and the second recess are portions of the polar plane;
conformally forming a barrier layer on the channel layer;
forming a first gate electrode on a portion of the barrier layer within the first region, wherein the first gate electrode extends along the polar plane of the channel layer; and
forming a first drain electrode and a first source electrode within the first region, wherein the first drain electrode and the first source electrode are located at opposite sides of the first gate electrode.

9. The manufacturing method of the high electron mobility transistor device of claim 8, wherein the first gate electrode is formed on a portion of the channel layer between the first recess and the second recess.

10. The manufacturing method of the high electron mobility transistor device of claim 9, wherein the first gate electrode further extends into the first recess and the second recess.

11. The manufacturing method of the high electron mobility transistor device of claim 8, further comprising:
forming a second gate electrode on a portion of the barrier layer within a second region of the high electron mobility transistor device; and
forming a second drain electrode and a second source electrode within the second region, wherein the second drain electrode and the second source electrode are located at opposite sides of the second gate electrode.

12. The manufacturing method of the high electron mobility transistor device of claim 8, further comprising:
forming a first electrode in portions of the channel layer and the barrier layer within a third region of the high electron mobility transistor device; and
forming a second electrode on a portion of the barrier layer within the third region, wherein the first electrode is located aside the second electrode.

13. The manufacturing method of the high electron mobility transistor device of claim 8, wherein the barrier layer entirely covers the channel layer.

14. A high electron mobility transistor device, comprising:
a channel layer, disposed on a substrate, wherein a surface of a portion of the channel layer located within a first region of the high electron mobility transistor device comprises a polar plane and a non-polar plane, a sidewall of a recess in the portion of the channel layer is the non-polar plane, and a bottom surface of the recess is a portion of the polar plane;
a barrier layer, conformally disposed on the channel layer;
a first gate electrode, disposed on the barrier layer and extending along the polar plane of the channel layer within the first region, wherein at least a portion of the first gate electrode is located in the recess; and
a first drain electrode and a first source electrode, disposed within the first region, and located at opposite sides of the first gate electrode.

* * * * *